(12) United States Patent
Liu et al.

(10) Patent No.: US 6,841,413 B2
(45) Date of Patent: Jan. 11, 2005

(54) THINNED DIE INTEGRATED CIRCUIT PACKAGE

(75) Inventors: Cheng-Yi Liu, Jhong-Li (TW); Johanna Swan, Scottsdale, AZ (US); Steven Towle, deceased, late of Phoenix, AZ (US); by Anna George, legal representative, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 4 days.

(21) Appl. No.: 10/036,389

(22) Filed: Jan. 7, 2002

(65) Prior Publication Data

US 2003/0127715 A1 Jul. 10, 2003

(51) Int. Cl.$^7$ .............................................. H01L 21/44
(52) U.S. Cl. ...................... 438/106; 451/57; 257/712; 257/713; 257/778
(58) Field of Search ........................... 451/57; 257/712, 257/713, 778, 612, 714, 720, 722; 438/106

(56) References Cited

U.S. PATENT DOCUMENTS

| | | | | |
|---|---|---|---|---|
| 5,144,747 A | * | 9/1992 | Eichelberger | 29/834 |
| 5,198,963 A | * | 3/1993 | Gupta et al. | 361/715 |
| 5,621,615 A | * | 4/1997 | Dawson et al. | 361/704 |
| 6,423,570 B1 | * | 7/2002 | Ma et al. | 438/106 |
| 6,472,762 B1 | * | 10/2002 | Kutlu | 257/778 |
| 6,552,267 B2 | * | 4/2003 | Tsao et al. | 174/52.4 |
| 6,559,670 B1 | * | 5/2003 | Motamedi | 324/765 |
| 6,672,947 B2 | * | 1/2004 | Tsao et al. | 451/57 |

* cited by examiner

*Primary Examiner*—David Nelms
*Assistant Examiner*—Mai-Huong Tran
(74) *Attorney, Agent, or Firm*—Schwegman, Lundberg, Woessner & Kluth, P.A.

(57) ABSTRACT

A method and apparatus provide an integrated circuit package with improved heat dissipation and easier fabrication. The integrated circuit package includes a thinned semiconductor die attached to a heat spreader using a thermally conductive material. The thinned die reduces the thermal resistance of the die/heat spreader combination to improve heat extraction from the die as well as eliminating processing steps in fabrication. Additionally, the thinned die becomes more compliant as it takes on the thermal/mechanical properties of the heat spreader to reduce stress-induced cracking of the die.

30 Claims, 10 Drawing Sheets

THINNED DIE INTEGRATED CIRCUIT PACKAGE

BACKGROUND OF THE INVENTION

1. Field of the Invention

The present invention relates generally to packaging semiconductor dice to produce integrated circuits. It particularly relates to packaging a semiconductor die that enables greater heat dissipation and build-up layer fabrication efficiency.

2. Background

Higher performance, lower cost, increased miniaturization of integrated circuit components and greater packaging density of integrated circuits are ongoing goals of the computer industry. As these goals are achieved, semiconductor dice become smaller. Of course, the goal of greater packaging density requires that the entire semiconductor die package be equal to or only slightly larger (about 10% to 30%) than the size of the semiconductor die itself. Such semiconductor die packaging is called a "chip scale packaging" or "CSP".

Figure 16:
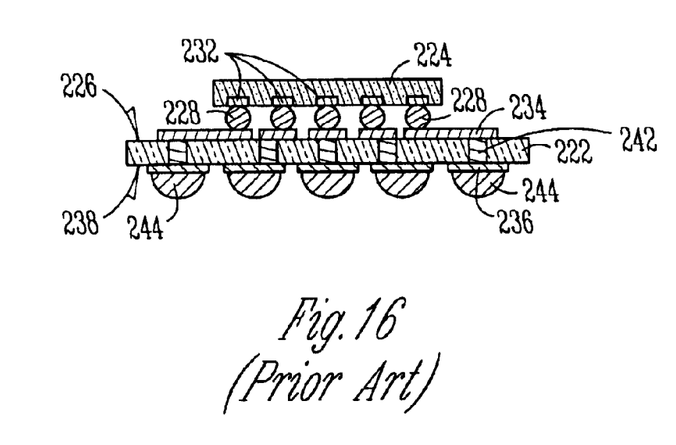
FIG. 16 illustrates a side cross-sectional view of a prior art CSP of a microelectronic device utilizing a substrate interposer.

Generally, for most CSP, the surface area provided by the active surface for most semiconductor dice does not provide enough surface for all of the external contacts needed to contact external devices for certain types of semiconductor dice. Additional surface area can be provided with the use of an interposer, such as a substantially rigid material or a substantially flexible material. FIG. 16 illustrates a substrate interposer 222 having a semiconductor die 224 attached to and in electrical contact with a first surface 226 of the substrate interposer 222 through solder balls 228. The solder balls 228 extend between contacts 232 on the semiconductor die 224 and conductive traces 234 on the substrate interposer first surface 226. The conductive traces 234 are in discrete electrical contact with bond pads 236 on a second surface 238 of the substrate interposer 222 through vias 242 that extend through the substrate interposer 222. External contacts 244 are formed on bond pads 236. The external contacts 244 are utilized to achieve electrical communication between the semiconductor die 224 and an external electrical system (not shown).

The use of the substrate interposer 222 requires a number of processing steps which increase the cost of the package. Additionally, the use of the small solder balls 228 presents crowding problems which can result in shorting between the small solder balls 228 and can present difficulties in inserting underfill material between the semiconductor die 224 and the substrate interposer 222 to prevent contamination and provide mechanical stability. Furthermore, the necessity of having two sets of solder balls (i.e., small solder balls 228 and external contacts 244) to achieve connection between the semiconductor die 224 and the external electrical system decreases the overall performance of the package.

Another problem arising from the fabrication of a smaller semiconductor die is that the density of power consumption of the integrated circuit components in the semiconductor die has increased, which, in turn, increases the average junction temperature of the die. If the temperature of the semiconductor die becomes too high, the integrated circuits of the semiconductor die may be damaged or destroyed. Furthermore, for semiconductor dice of equivalent size, the overall power increases which presents the same problem of increased power density.

Various apparatus and techniques have been used for removing heat from semiconductor dice. Some techniques involve the use of encapsulation materials to encapsulate semiconductor dice on to a heat spreader, or to embed (secure) semiconductor dice into recesses (cavities) within a heat spreader for heat dissipation. The use of these techniques produces additional, complicated processing steps for fabricating an integrated circuit package. Therefore, it would be advantageous to develop new apparatus and techniques for integrated circuit fabrication that eliminate complicated processing steps and the necessity of the substrate interposer, and provides improved heat dissipation.

DETAILED DESCRIPTION

In accordance with embodiments of the present invention, the formation of a thinned semiconductor die attached to a planar heat spreader, and in combination with at least one bumpless build-up layer (BBUL) produces a number of advantages for an integrated circuit package. One advantage is that the use of a thin die allows for easier formation of one or more build-up layers over the die and heat spreader combination since extra processing steps are not needed to make the top surface of the die/heat spreader combination planar (flat). Other significant advantages include the following: 1) the heat spreader may be planar (as opposed to irregular, non-planar shapes) which allows for easier fabrication, 2) easier attachment of the die to the heat spreader as compared to "die embedded-in-heat spreader"

techniques since precise control of depositing material in the bottom of a cavity is not necessary (particularly advantageous for a self-aligned solder approach), and 3) no encapsulation of the die to the heat spreader is required as with other techniques.

Other advantages include the build-up layer/dielectric deposition process that creates a planarized build-up layer which is void-free. These characteristics ensure an efficient copper patterning process (e.g., conductive trace formation) and good reliability for the integrated circuit package. Additionally, the thinned die reduces the thermal resistance of the die/heat spreader combination to improve heat extraction from the die. The thinned die also is more compliant so it stretches and contracts in concert with the thermal/mechanical properties of the heat spreader, thus reducing stress-induced cracking of the package. Furthermore, several processing steps are eliminated from comparable procedures for making bumpless build up packages which include, but are not limited to, taping, tape residue cleaning, encapsulation material injection, die embedding, and other processing steps.

Although FIGS. 1–15 illustrate various embodiments of the present invention, these figures are not meant to portray integrated circuit (microelectronic) packages in precise detail. Rather, these figures illustrate integrated circuit packages in a manner to more clearly convey the concepts of the present invention. Additionally, elements common between the figures retain the same numeric designation.

Embodiments of the present invention include a packaging technology that places one or more thinned semiconductor (microelectronic) dice on a planar heat spreader and secures the semiconductor dice on to the heat spreader. In one embodiment, the die may be attached to the heat spreader using an adhesive material, such as solder or a polymeric material. In an alternative embodiment, the die may be bonded to the heat spreader by a direct metallurgical bond, such as may be formed by interdiffusion of Au (gold) and Si (silicon). Alternative methods of forming a bond between the die and the heat spreader may also be used. A build-up layer (or layers) of dielectric materials and conductive traces is then fabricated on the semiconductor die and the heat spreader to form an integrated circuit package.

These embodiments enable the integrated circuit package to be built around the thinned semiconductor die. Yet further, the configurations of the present invention allow for direct bumpless build-up layer techniques to be used which allows the package to be scaleable. The configurations also result in thinner form factors, as the die is very thin and no additional heat spreader is needed for the package.

Figure 1:
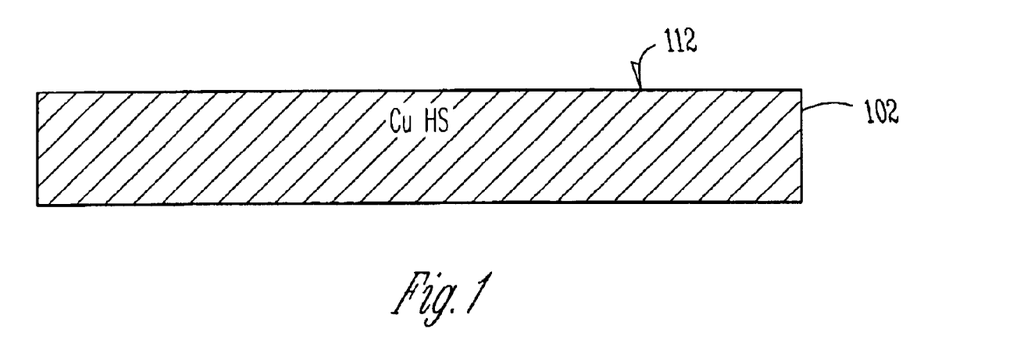
FIG. 1 illustrates a heat spreader in accordance with embodiments of the present invention.

FIG. 1 illustrates a heat spreader 102 used to fabricate an integrated circuit package in accordance with embodiments of the present invention. The heat spreader 102, having a top surface 112, preferably comprises a substantially planar (flat), highly thermally conductive material to remove the power dissipated in a semiconductor die. The material used to fabricate the heat spreader 102 may include, but is not limited to, metals such as copper, copper alloys including copper alloys with tungsten, copper laminates, molybdenum, molybdenum laminates, molybdenum alloys, aluminum, aluminum alloys including metallized aluminum nitride, beryllium oxide, diamond and the like. The aluminum nitride may be metallized with chromium/gold, titanium/gold, or nickel/gold films. The material used to fabricate the heat spreader may also include, but is not limited to, thermally conductive ceramic materials, such as AlSiC, AlN, and the like. The thermal coefficient of expansion (TCE) of the heat spreader material should be chosen to minimize crack-inducing stresses. For example, by closely matching the TCE of the heat spreader material (e.g., AlSiC) to silicon, incidents of stress-induced die cracking may be reduced. In an alternative embodiment for thinned semiconductor die, heat spreader 102 may be made of materials (e.g., copper) of larger TCE mismatch to silicon (an exemplary semiconductor die material), but closely matching the overall TCE of the build up materials. Also, the heat spreader may be formed of materials with a close TCE match to a motherboard upon which the thinned die integrated package may be placed for operation (e.g., a central processing unit—CPU—for a computer). The thinness of the die will allow it to conform to the thermally-induced dimensional changes of the heat spreader.

Figure 2:
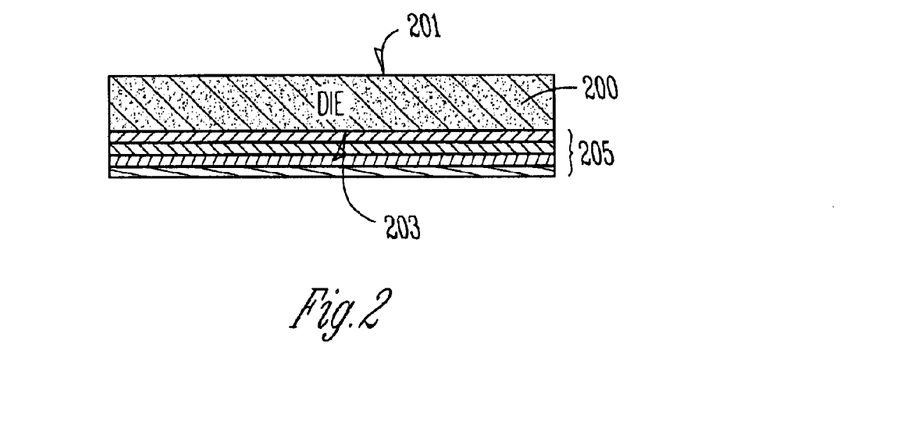
FIG. 2 illustrates a semiconductor die in accordance with embodiments of the present invention.

FIG. 2 illustrates a semiconductor die 200 used for fabricating an integrated circuit package in accordance with embodiments of the present invention. Semiconductor die 200 has an active surface 201 and a back surface 203. The thickness of die 200, which may be formed from a silicon wafer, may be thinned down (to 100 microns-($\mu$m) or less) by one or more of various techniques including plasma etching, chemical etching, grinding, and polishing. After the thinning process, a metallization layer 205 may be deposited on to the back surface 203. The metallization layer 205 may include a plurality of sublayers formed of metals or metal alloys including titanium, nickel, vanadium, tin, and/or gold.

Figure 3:
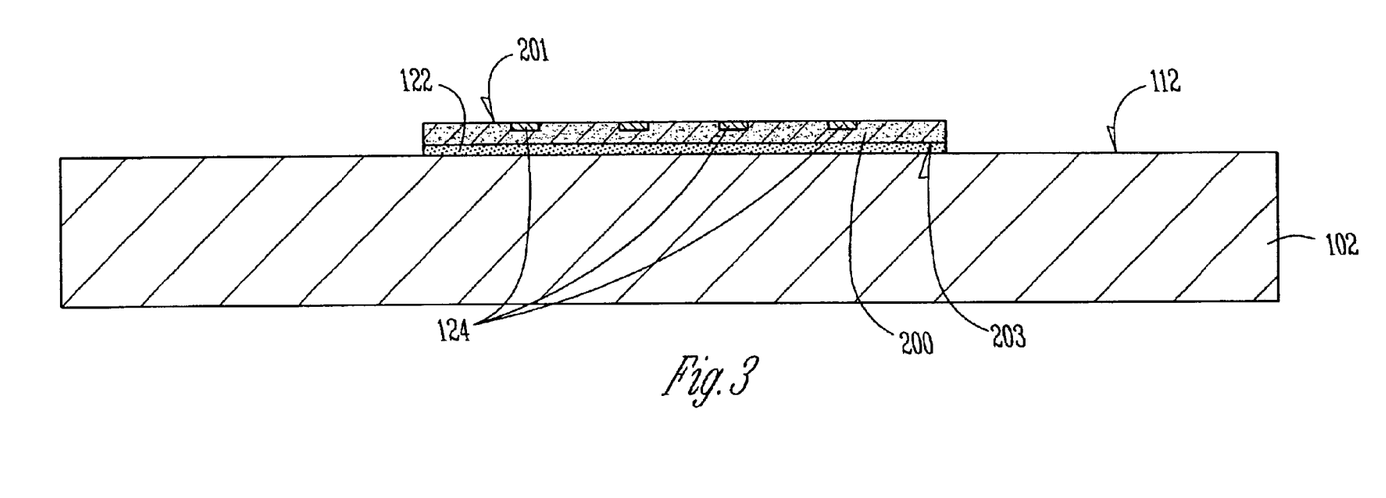
FIGS. 3–9 are side cross-sectional views of a method of forming build-up layers on the semiconductor die and heat spreader, in accordance with embodiments of the present invention.

FIG. 3 illustrates a view of a single semiconductor die 200 attached (mounted) with an adhesive (interface) material 122 to the top surface 112 of heat spreader 102. A thermal bonding machine may be used to attach the die 200 to heat spreader 102. In one embodiment, a thermally conductive adhesive material 122 may be used to attach the die 200 to heat spreader 102, though alternative embodiments without such adhesive material may instead be used. Thermally conductive adhesive material 122 allows heat to be transferred by conduction from semiconductor die 200 to heat spreader 102. The adhesive material 122 may comprise a resin or epoxy material filled with thermally conductive particulate material, such as silver or aluminum nitride. The adhesive material 122 may also comprise metal and metal alloys having low melting temperatures (e.g., solder materials and the like) to form a metallurgical bond between the die and heat spreader. Other techniques, not requiring a low melting temperature, may be used for forming a metallurgical bond between the die and heat spreader (e.g., diffusion bonding).

As shown in FIG. 3, the semiconductor die 200 may include a plurality of electrical contacts 124 located on the semiconductor die active surface 201. The electrical contacts 124 are electrically connected to circuitry (not shown) within the semiconductor die 200. Only four electrical contacts 124 are shown for sake of simplicity and clarity.

As shown in FIGS. 4a–7, in accordance with embodiments of the present invention, one or more bumpless build-up layers (illustrated as dielectric layers 126, 138 and conductive traces 136, 146) may be built on top of the active surface 201 of semiconductor die 200 and exposed top surface 112 (those portions not covered by die 200) of heat spreader 102 to create electrical contacts with external devices. Due to the thinness of die 200 and interface material 122, the build-up layers, including one or more dielectric layers 126, 138, may be emplaced (positioned) such that it substantially planarizes the exposed top surfaces 201 and 112 of die 200 and heat spreader 102. One of a plurality of build-up processes may be used such as spin-on coating, curtain coating, slot coating, roll coating, squeegee application, or dry film lamination. Although the following description relates to a bumpless, built-up layer technique for the formation of one or more build-up layers, the method of fabrication is not so limited. The build-up layers may be fabricated by a variety of techniques known in the art.

Figure 4A:
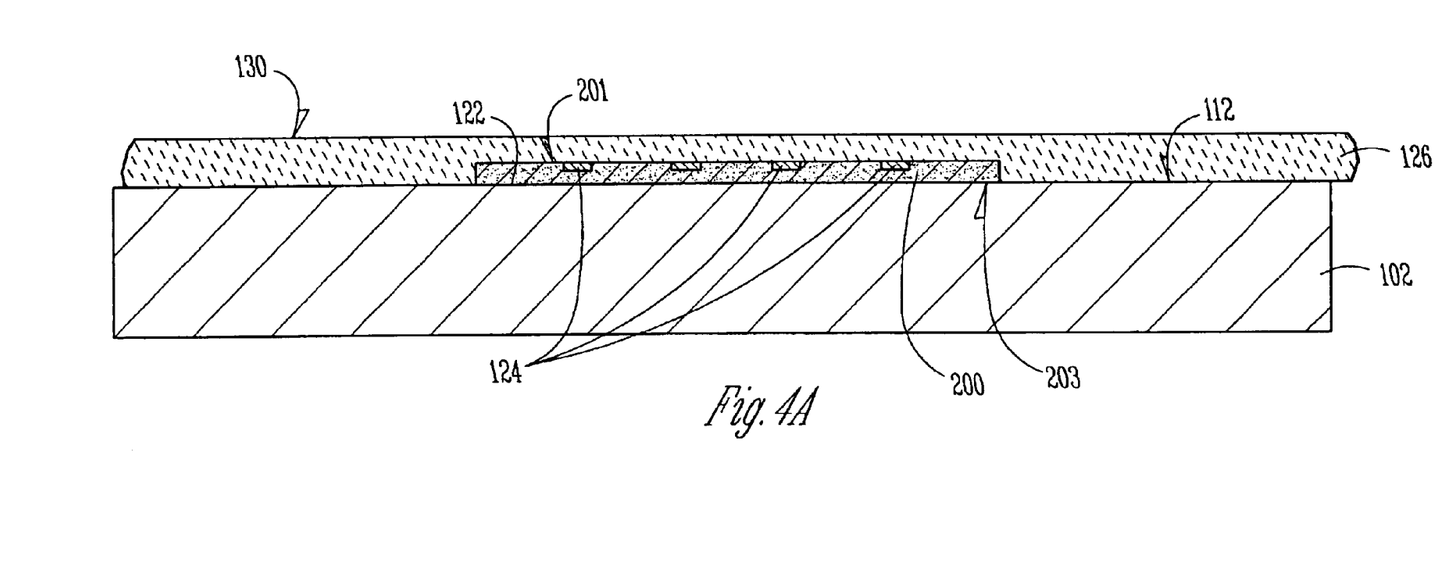
Figure 4B:
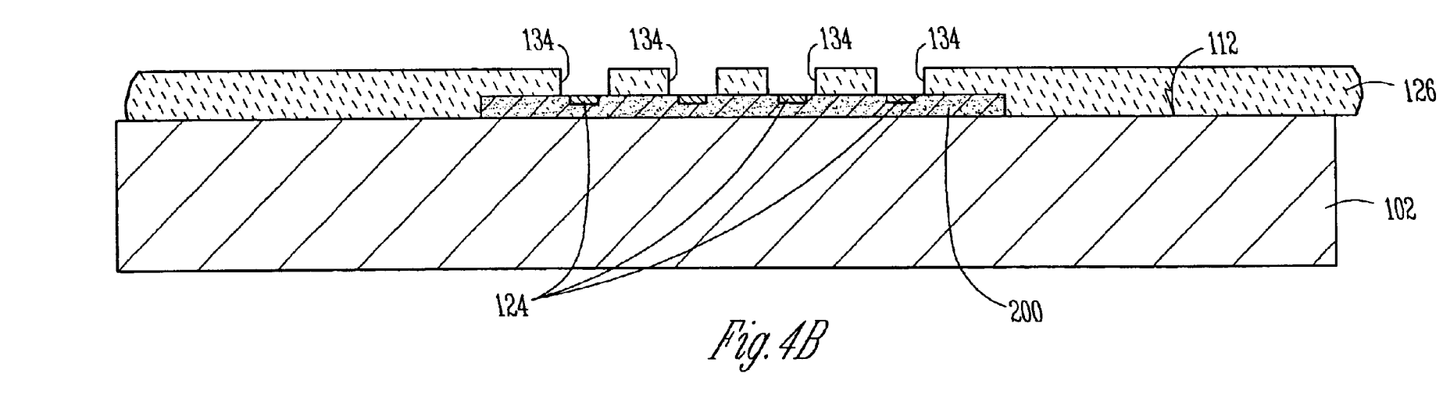
Figure 5:
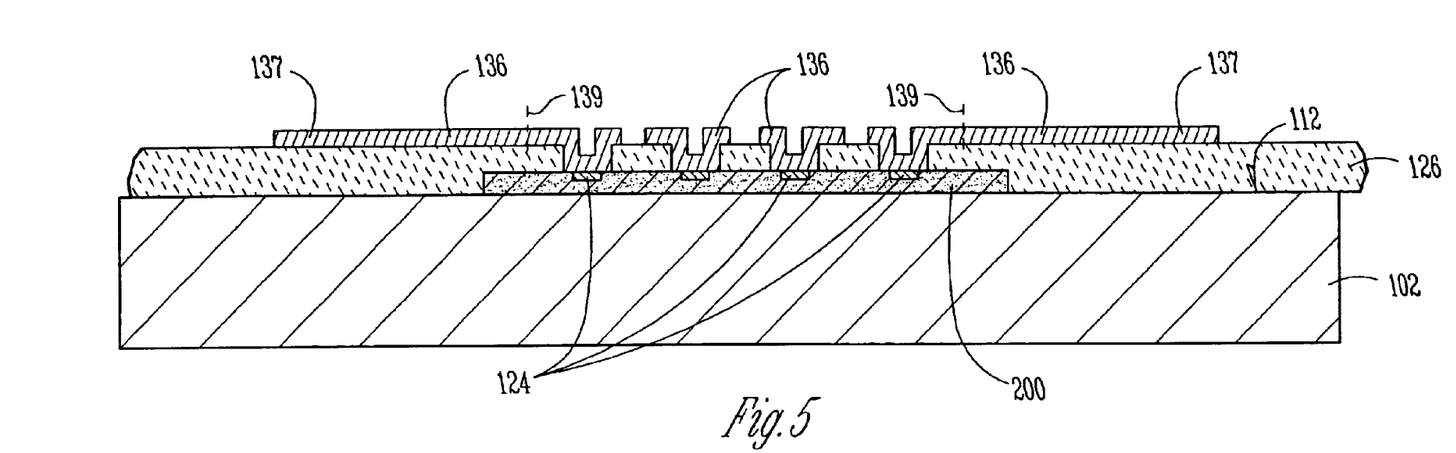

As shown in FIGS. 4a–5, as part of the formation of a first, bumpless build-up layer (illustrated as dielectric layer 126 and conductive traces 136), a first dielectric layer 126, such as epoxy resin, polyimide, bisbenzocyclobutene, and the like, may be disposed over the semiconductor die active surface 201 (including the electrical contacts 124) and the exposed top surface of heat spreader 102. The dielectric layers of the present invention are preferably filled epoxy resins available from Ibiden U.S.A. Corp., Santa Clara, Calif., U.S.A. and Ajinomoto U.S.A., Inc., Paramus, N.J., U.S.A. The first dielectric layer 126 may flow completely over the exposed top surfaces of die 200 and heat spreader 102. The formation of the first dielectric layer 126 may be achieved by any known process, including but not limited to spin-on coating, curtain coating, slot coating, roll coating, squeegee application, spray-on deposition, or dry film lamination. Preferably, an exposed surface 130 of the first dielectric layer 126 is substantially planar. The degree to which such processes are able to planarize the surface will depend on the type of formation process used, the properties of the dielectric precursor material and the process parameters used. Further planarization may take place during curing of the material.

If the first dielectric layer exposed surface 130 is not sufficiently planar, any known planarization technique, such as chemical mechanical polishing, etching, and the like, may be employed. Additional planarization may also be achieved emplacing the dielectric material in two or more separate steps.

As shown in FIG. 4b, a plurality of vias (holes) 134 may be formed through the first dielectric layer 126. The plurality of vias 134 may be formed any method known in the art, including but not limited to laser drilling, photolithography, and, if the first dielectric layer 126 is photoactive, forming the plurality of vias 134 in the same manner that a photoresist mask is made in a photolithographic process, as known in the art.

A plurality of conductive traces 136 may be formed on the first dielectric layer 126, as shown in FIG. 5, wherein a portion of each of the plurality of conductive traces 136 extends into at least one of said plurality of vias 134 (see FIG. 4b) to make electrical contact with the electrical contacts 124, or with the top surface of the heat spreader 112. At least a portion of the plurality of conductive traces 136 may include a landing pad 137 (demarcated by dashed line 139). The plurality of conductive traces 136 may be made of any applicable conductive material, such as copper, aluminum, and alloys thereof.

The plurality of conductive traces 136 may be formed by any known technique, including but not limited to semi-additive plating and photolithographic techniques. An exemplary semi-additive plating technique can involve depositing a seed layer, such as sputter-deposited or electroless-deposited metal, such as copper, on the first dielectric layer 126. A resist layer is then patterned on the seed layer followed by electrolytic plating of a layer of metal, such as copper, on the seed layer exposed by open areas in the patterned resist layer. The patterned resist layer is stripped and portions of the seed layer not having the layer of metal plated thereon is etched away. Other methods of forming the plurality of conductive traces 136 will be apparent to those skilled in the art.

If the plurality of conductive traces 136 is not capable of placing the plurality of vias 134 in an appropriate position or if electrical performance requirements of the build-up layer are not met, then additional build-up layers may be formed. To form an additional build-up layer, an additional dielectric layer may be formed on the upper surface of the first build-up layer, and another plurality of vias may be formed in this additional dielectric layer, such as described in FIGS. 4a–5. The layering of dielectric layers and the formation of conductive traces can be repeated until the vias are in an appropriate position and any other requisite structures are formed. Thus, portions of a single conductive trace may be formed from multiple portions thereof and can reside on different dielectric layers. Additional dielectric layers and conductive layers may be included in order to provide power and ground planes which ensure adequate power distribution and control impedance.

Figure 6A:
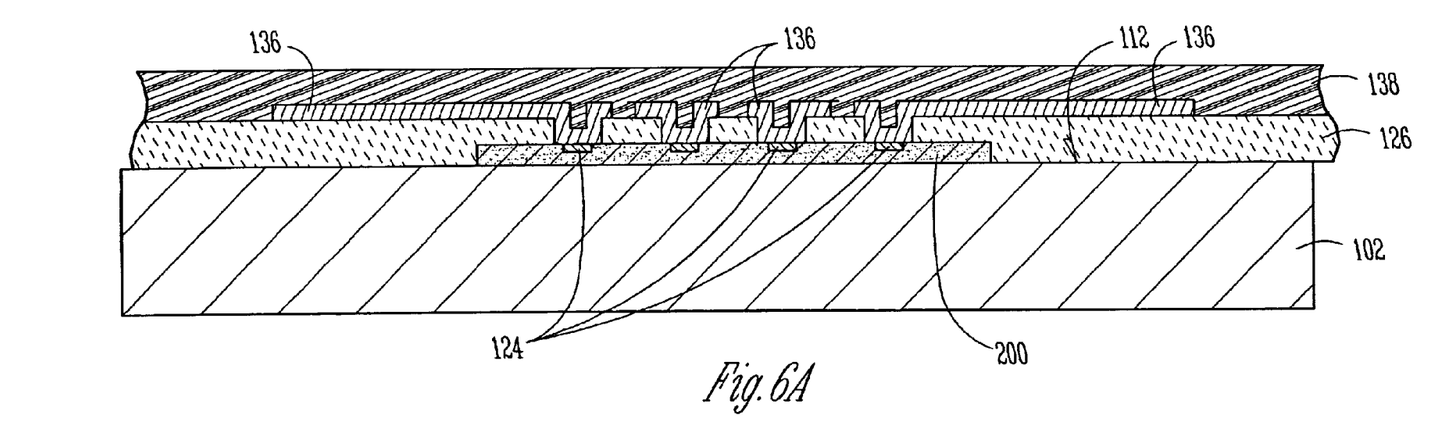
Figure 7:
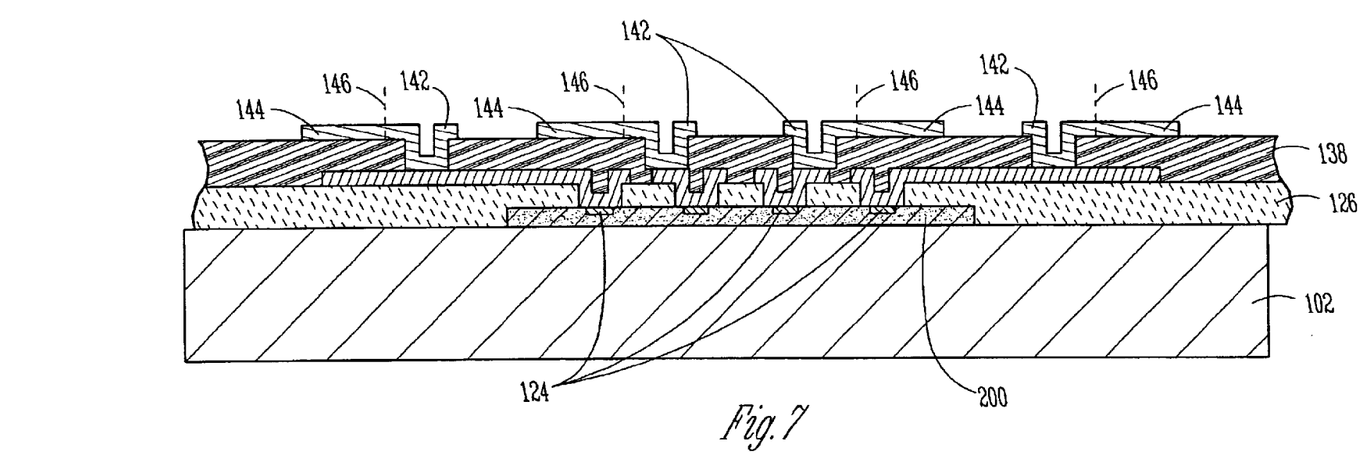

The process sequence for formation of additional build-up layers is illustrated in FIGS. 6a–7. As shown in FIG. 6a, a second dielectric layer 138 may be disposed over the plurality of conductive traces 136 and the first dielectric layer 126. The formation of second dielectric layer 138 may be achieved by any known process including, but not limited to, spin-on coating, curtain coating, slot coating, roll coating, squeegee application, spray-on deposition, or dry film lamination.

Figure 6B:
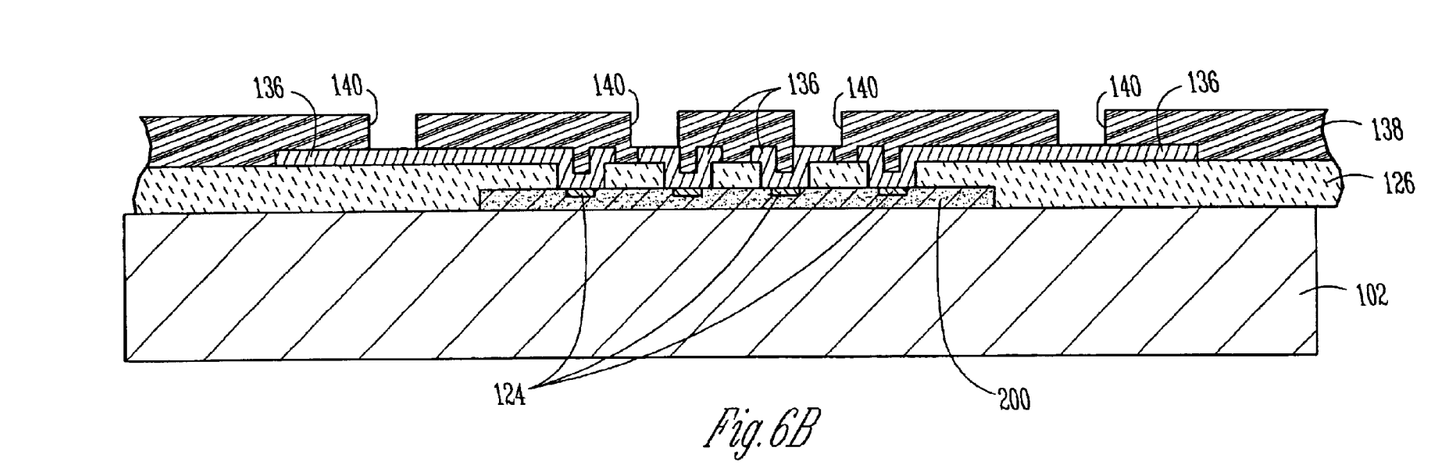

As shown in FIG. 6b, a plurality of second vias 140 may be then formed through the second dielectric layer 138. The plurality of second vias 140 may be formed any method known in the art, including but not limited to laser drilling and, if the second dielectric layer 138 is photoactive, forming the plurality of second vias 140 in the same manner that a photoresist mask is made in a photolithographic process, as known in the art.

As shown in FIG. 7, a second plurality of conductive traces 142 may be formed, wherein a portion of each of the second plurality of conductive traces 142 extends into at least one of said plurality of second vias 140 (see FIG. 6b). Also, the second plurality of conductive traces 142 may each include a landing pad 144 (demarcated by a dashed line 146).

Figure 8:
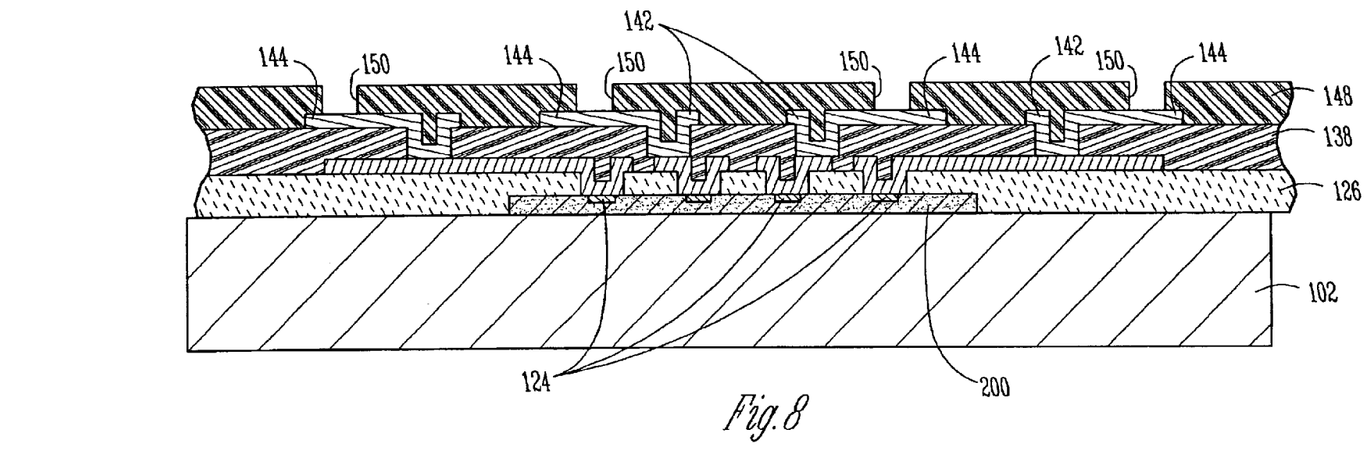
Figure 9:
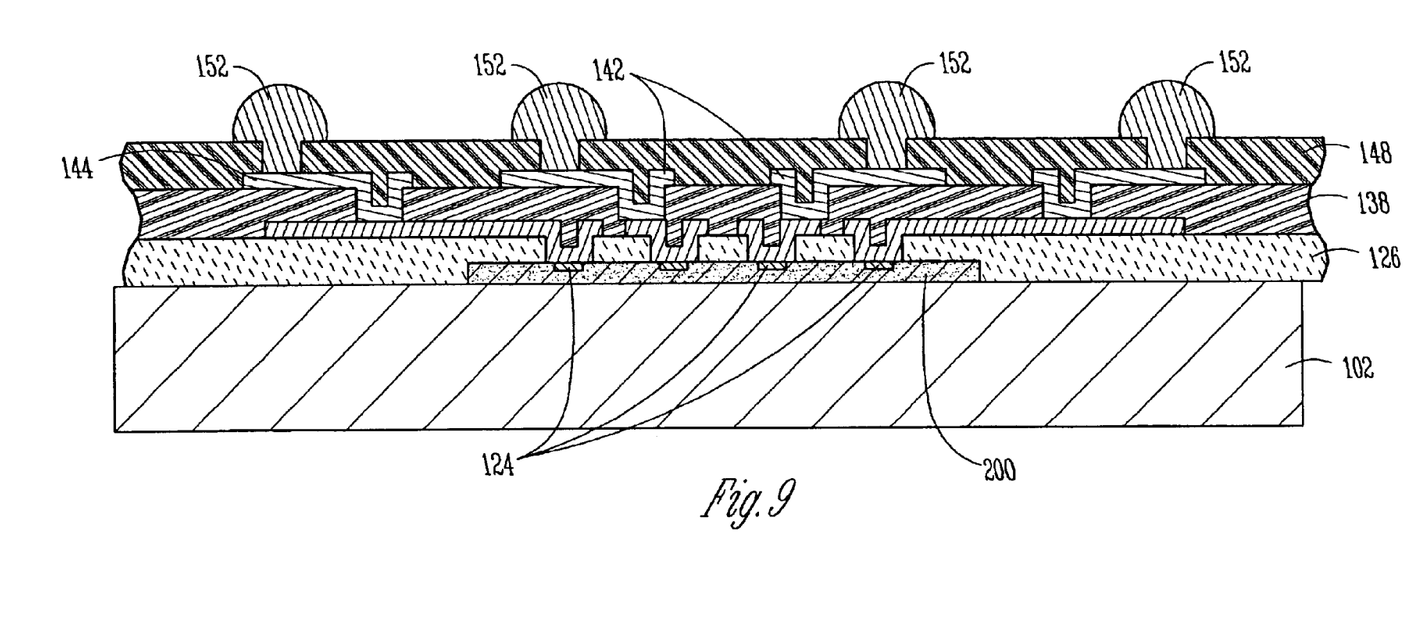

Once the final plurality of conductive traces 142 and landing pads 144 is formed, this combination can be used in the formation of conductive interconnects, such as solder bumps, solder balls, pins, and the like, for communication with external components (not shown). For example, a solder mask material 148 can be disposed over the second dielectric layer 138 and the second plurality of conductive traces 142 and landing pads 144. A plurality of vias 150 may be then formed in the solder mask material 148 to expose at least a portion of each of the landing pads 134, as shown in FIG. 8. A plurality of conductive bumps 152, such as solder bumps, can be formed, such as by screen printing or ink-jetting solder paste followed by a reflow process, by placement of solder balls, or by known plating techniques, on the exposed portion of each of the landing pads 144, as shown in FIG. 9.

Figure 10A:
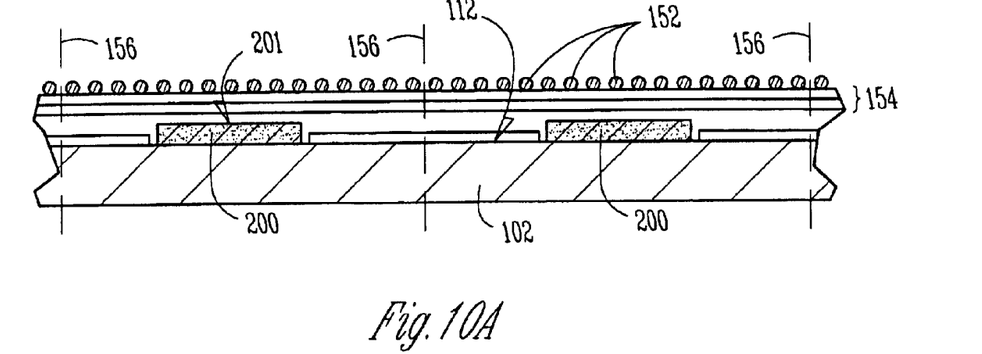
FIG. 10a is a side cross-sectional view of a heat spreader having a plurality of semiconductor dice including build-up layers and solder balls positioned thereon, in accordance with embodiments of the present invention.
Figure 10B:
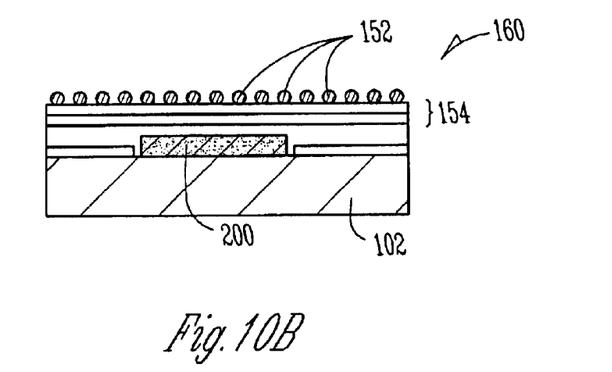
FIG. 10b is a side cross-sectional view of a singulated device, diced from the assembly of FIG. 10a, in accordance with embodiments of the present invention.

FIG. 10a illustrates a plurality of semiconductor dice 200 residing on the heat spreader 102 to form a plurality of conjoined microelectronic packages. At least one build-up layer is formed on the semiconductor dice active surfaces 201 and the exposed top surface 112 of the heat spreader 102. The layer(s) of dielectric material and conductive traces comprising the build-up layer(s) is simply designated together as build-up layer 154 in FIG. 10a. The individual semiconductor dice 200 are then singulated by cutting (e.g., simultaneously) along lines 156 through the build-up layer 154 and the heat spreader 102 to form a plurality of integrated circuit (microelectronic) packages such as singulated integrated circuit package 160, as shown in FIG. 10b.

Figure 11:
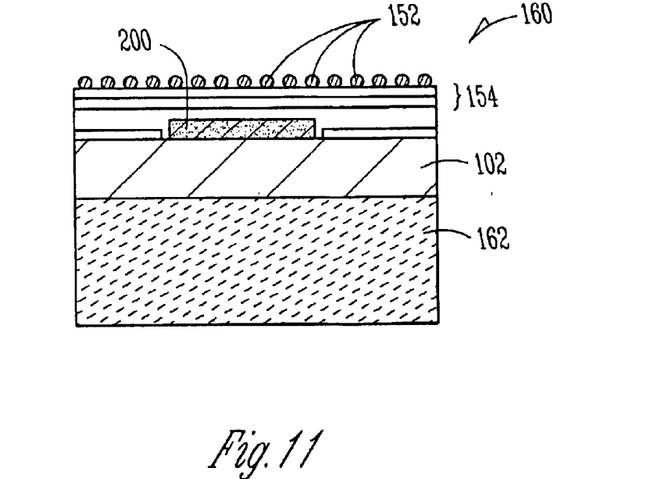
FIG. 11 is a side cross-sectional view of the singulated device having a heat dissipation device attached to the heat spreader, in accordance with embodiments of the present invention.

Preferably, the heat spreader 102 adequately removes the heat from the semiconductor die 200. However, if the heat spreader 102 does not do so, a conductive heat sink 162 may be attached to the heat spreader 102, as shown in FIG. 11. The material used to fabricate the heat sink 162 may include, but is not limited to, metals (copper, molybdenum, aluminum, alloys thereof, and the like), ceramics (AlSiC, AlN, and the like), a heat pipe, or other means of removing thermal energy.

Figure 12A:
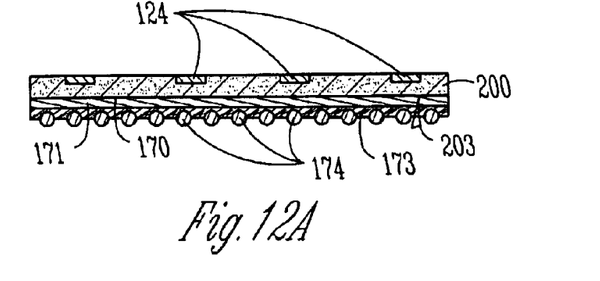
FIGS. 12a–12c illustrate a self-aligned solder embodiment for attaching a semiconductor die to a heat spreader in accordance with embodiments of the present invention.

FIGS. 12a–14 illustrate a self-aligning solder embodiment of the present invention to simply and accurately attach the semiconductor die 200, by back surface 203, to the top surface of the heat spreader 102 while providing thermal conduction between the semiconductor die 200 and the heat spreader 102. As shown in FIG. 12a, a first plurality of solder bumps 174, preferably highly thermally conductive material such as a lead, nickel, vanadium, tin, indium, gallium, bismuth, cadmium, zinc, copper, gold, silver, antimony, germanium, and alloys thereof, most preferably indium-based or tin-based solder, is formed across an entire wafer 170 before the semiconductor die 200 is diced therefrom. This ensures that the first plurality of solder bumps 174 is positioned the same on all semiconductor dice 200 and to reduce cost. The first plurality of solder bumps 174 may be aligned with a particular element, such as a fiducial marker (not shown), on the front side of the wafer.

The solder bumps 174 may be formed by first applying a wetting layer 171, such as a seed layer as known in the art, to the back surface of the wafer corresponding to the semiconductor die back surface 203. A removable solder dam 173, such as a photoresist, is patterned over the wetting layer 171 to prevent the solder of the solder bumps 174 prematurely wetting across the wetting layer 171. The solder bumps 174 may be formed by a plating technique, or by screen printing or ink-jetting a paste into openings in the photoresist and reflowing the paste to form solder bumps.

Figure 12B:
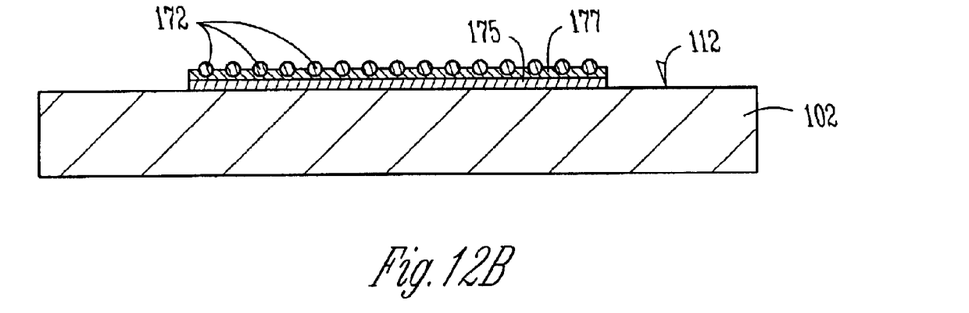
Figure 12C:
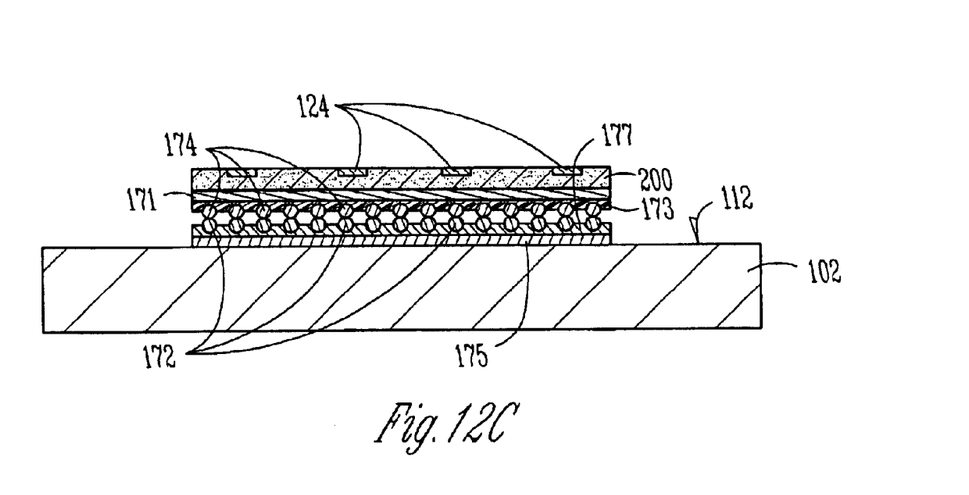

As shown in FIG. 12b, a second plurality of solder bumps 172 may be disposed on the top surface 112 of the heat spreader 102, with a wetting layer (if necessary) 175 and a removable solder dam 177, using the technique described above. The second plurality of solder bumps 172 may be made from materials such as described for the first plurality of solder bumps 174. The second plurality of solder bumps 172 may be aligned with a feature, such as a fiducial marker (not shown) on the heat spreader 102. As shown in FIG. 12c, the semiconductor die 200 (after dicing) is placed on (mounted on) the top surface 112 of heat spreader 102. The die 200 is placed such that the first plurality (set) of solder bumps 174 and the second plurality of solder bumps 172 fall one on top of the other. Thereafter, upon reflowing the solder, the two sets of bumps 172, 174 join and surface tension pulls the die 200 into the aligned position. Each plurality of solder balls may include subsets of balls of different sizes and composition to facilitate initial alignment and optimize the accuracy of final alignment. It is understood to those skilled in the art that one could apply solder bumps to either the semiconductor die 200 or the heat spreader top surface 112 alone.

Figure 13:
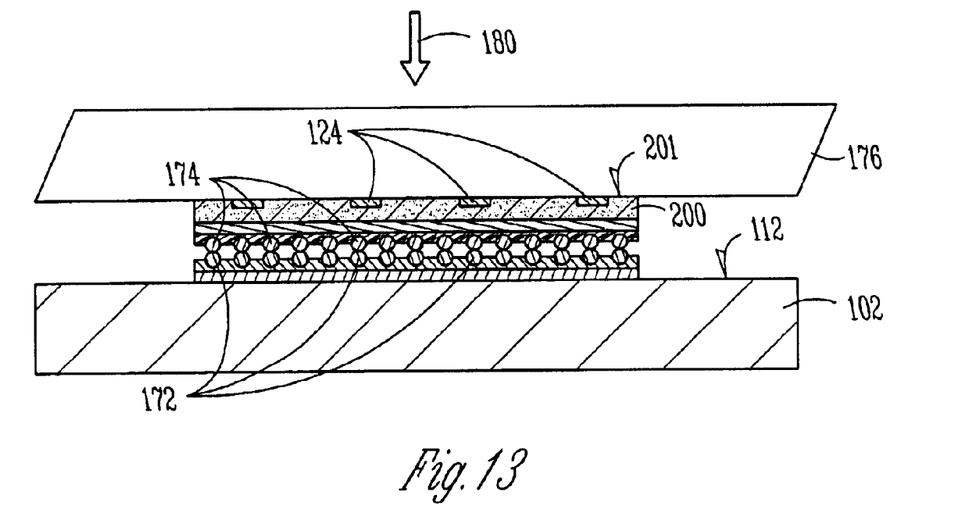
FIG. 13 is a side cross-sectional view of the assembly of FIG. 12c having a platen abutting an active surface of the semiconductor die, in accordance with embodiments of the present invention.
Figure 14:
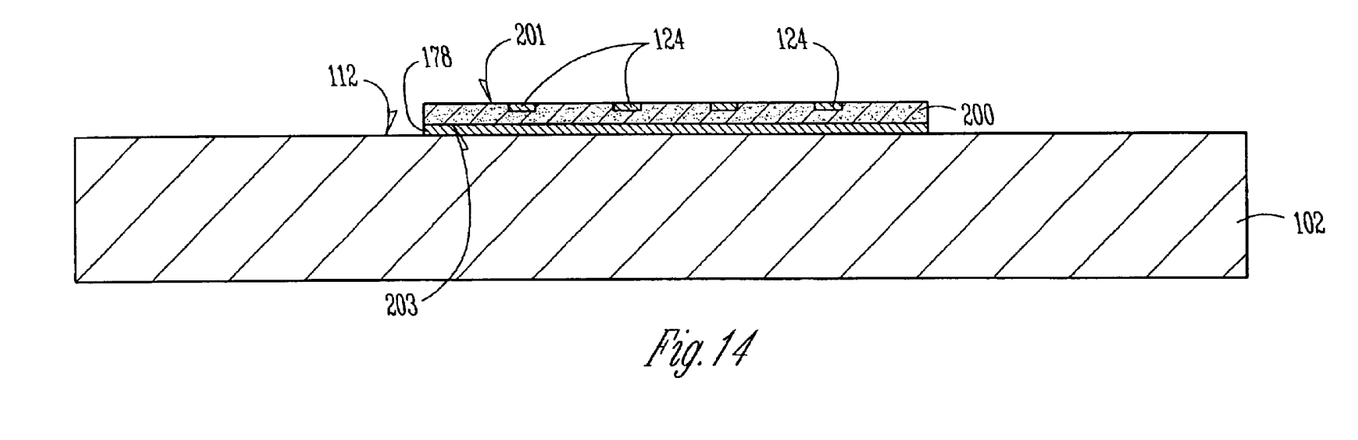
FIG. 14 is a side cross-sectional view of the heat spreader having the semiconductor die attached to the bottom surface of the heat spreader with solder, in accordance with embodiments of the present invention.

After reflow, the semiconductor die removable solder dam 173 and the heat spreader removable solder dam 177 are then removed, such as by a photoresist strip process as known in the art. Next, as shown in FIG. 13, a platen 176 is placed against the semiconductor die active surface 201 to hold the semiconductor die 200 in place horizontally while compressing vertically and heating under a vacuum or partial vacuum to again reflow the solder of the first plurality of solder balls 172 and the second plurality of solder balls 174 (now joined to form a single set of solder balls). In this process, any relative horizontal movement should be avoided while pressing vertically in direction 180. The pressure is not released until after the solder has cooled below its melting temperature. This results in a substantially continuous thermal contact solder layer 178 between the semiconductor die back surface 203 and the heat spreader top surface 112, as shown in FIG. 14. The vacuum or partial vacuum helps prevent or eliminate the presence of air bubbles within the substantially continuous thermal contact solder layer 178. The use of the platen 176 (see FIG. 13) also results in the heat spreader top surface 112 and the semiconductor die back surface 203 becoming tightly, thermally bonded to increase heat transfer between the die 200 and the heat spreader 102. The amount of down-force applied in direction 180 and its duration of application may be used to modulate the thickness of the solder layer.

Figure 15:
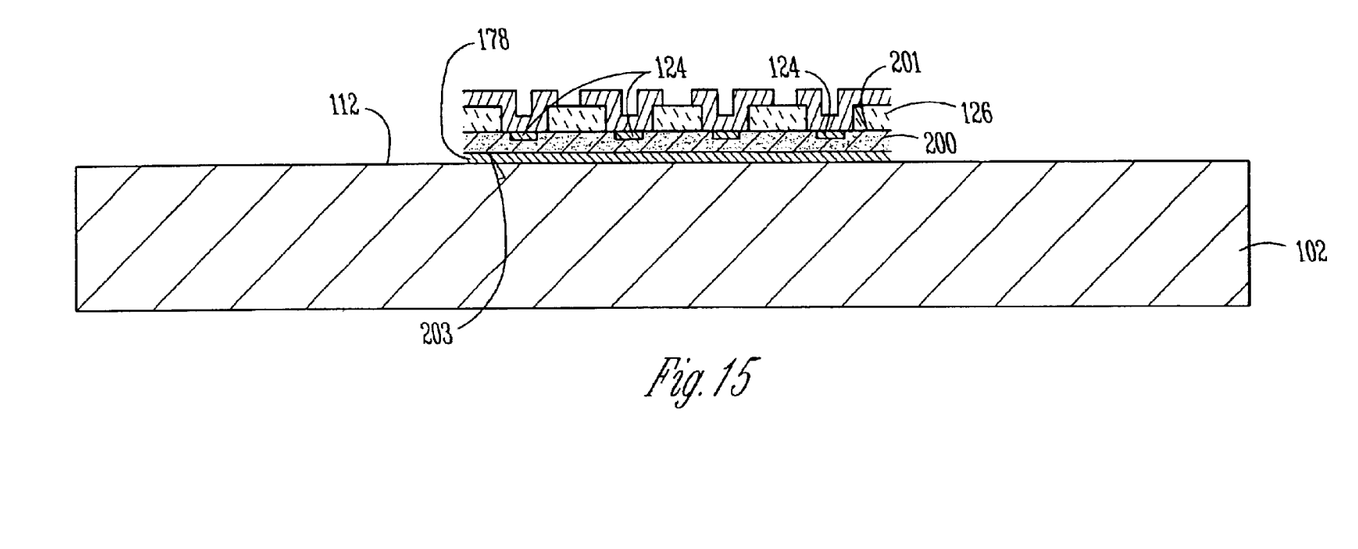
FIG. 15 is a side cross-sectional view of a build-up layer on the heat spreader and semiconductor die of FIG. 14, in accordance with embodiments of the present invention.

As previously discussed, a build-up layer (illustrated as a dielectric layer 126 and conductive traces 136) may be then formed on the semiconductor die active surface 201 and the heat spreader first surface 112, as shown in FIG. 15.

It is, of course, understood that individual packages may be formed by cutting through the heat spreader and portions of the build-up layer, as previously discussed and illustrated.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A method of fabricating an integrated circuit package, comprising:
    mounting a thinned semiconductor die on a planar surface of a heat spreader, wherein mounting includes attaching said die to the heat spreader by metal to metal diffusion bonding.

2. The method of claim 1, wherein mounting includes mounting said die on to the heat spreader using a thermally conductive material.

3. The method of claim 1, wherein said die has a thickness of no more than 100 μm.

4. The method of claim 1, wherein said die is made thin by at least one of plasma etching, grinding, polishing, and chemical etching.

5. A method of fabricating an integrated circuit package, comprising:
    mounting a thinned semiconductor die on a planar surface of a heat spreader; and
    forming at least one build-up layer over the die and heat spreader.

6. The method of claim 5, wherein forming includes emplacing a dielectric material to planarize exposed top surfaces of the heat spreader and the die.

7. The method of claim 6, wherein forming includes forming at least one build-up layer that includes at least one conductive trace contacting at least one contact on said die.

8. The method of claim 7, wherein forming includes forming at least two build-up layers, said at least two build-up layers including at least one dielectric layer disposed on at least a portion of the at least one conductive trace, and at least one second conductive trace extending through the at least one dielectric layer to contact the at least one conductive trace.

9. The method of claim 6, wherein forming a build-up layer includes emplacing the dielectric material by one of spin coating, curtain coating, slot coating, roll coating, squeegee application, or dry film lamination.

10. A method of fabricating an integrated circuit package, comprising:

mounting a thinned semiconductor die on a planar surface of a heat spreader; and forming a metallization layer on said die.

11. A method of fabricating an integrated circuit package, comprising:

providing a planar heat spreader;

mounting a plurality of thinned semiconductor dice on to a planar surface of said heat spreader to form a plurality of conjoined microelectronic packages; and singulating said plurality of conjoined microelectronic packages.

12. The method of claim 11, further including forming at least one build-up layer over top surfaces of the die and the heat spreader.

13. The method of claim 12, further including singulating said plurality of microelectronic packages by simultaneously cutting through said heat spreader and said at least one build-up layer.

14. The method of claim 12, further including forming a set of contacts to connect to an external component, the external component including a motherboard.

15. The method of claim 11, wherein mounting includes mounting the plurality of semiconductor dice on to the heat spreader using a thermally conductive material.

16. The method of claim 15, wherein mounting includes forming a diffusion bond.

17. The method of claim 11, wherein said die as a thickness of no more than 100 um.

18. A method of fabricating an integrated circuit package, comprising:

mounting a thinned semiconductor die on a planar surface of a heat spreader, wherein the thinned semiconductor die has a thickness of no more than 100 $\mu$m, and wherein mounting includes:

depositing a metallization layer on a back surface of the die.

19. The method according to claim 18, wherein the metallization layer includes a plurality of sublayers.

20. The method according to claim 18, wherein the metallization layer includes a plurality of sublayers, selected from titanium, nickel, vanadium, and tin; titanium, nickel, vanadium, and gold; and titanium, nickel, vanadium, an tin and gold.

21. The method according to claim 18, wherein mounting is carried out by thermal bonding.

22. The method according to claim 18, wherein mounting includes forming a diffusion bond.

23. The method according to claim 18, further including:

forming at least one build-up layer over the die and heat spreader.

24. The method according to claim 18, further including:

forming at least two build-up layers over the die and heat spreader.

25. The method according to claim 18, wherein the thinned semiconductor die is one of a plurality of thinned semiconductor dice mounted on the planar surface of said heat spreader to form a plurality of conjoined microelectronic packages.

26. The method according to claim 25, further including:

forming at least one build-up layer that includes a conductive trace contacting at least one contact on one of said dice.

27. The method according to claim 25, further including:

forming at least one build-up layer that includes a conductive trace contacting at least one contact on one of said dice; and singulating said plurality of conjoined microelectronic packages.

28. The method according to claim 27, where singulating includes singulating said plurality of microelectronic packages by simultaneously cutting through said heat spreader and said at least one build-up layer.

29. The method according to claim 25, wherein mounting includes mounting the plurality of semiconductor dice on to the heat spreader using a thermally conductive material.

30. The method according to claim 25, wherein mounting includes forming a diffusion bond.

* * * * *